United States Patent [19]

van den Enden et al.

[11] 4,041,478

[45] Aug. 9, 1977

[54] MEMORY DEVICE

[75] Inventors: Adrianus Wilhelmus Maria van den Enden; Franciscus Antonius Kuipers; Edmond de Niet; Willem Frederik Druyvesteyn, all of Eindhoven, Netherlands

[73] Assignee: U.S. Philips Corporation, New York, N.Y.

[21] Appl. No.: 625,024

[22] Filed: Oct. 23, 1975

[30] Foreign Application Priority Data

Oct. 31, 1974 Netherlands ............... 7414216

[51] Int. Cl.² .................................. G11C 11/02
[52] U.S. Cl. ..................... 340/174 TF; 333/7 R
[58] Field of Search ......................... 340/174 TF

[56] References Cited

U.S. PATENT DOCUMENTS

| 3,737,882 | 6/1973 | Furuoya | 340/174 TF |
| 3,751,597 | 8/1973 | Bonyhard | 340/174 TF |
| 3,770,895 | 11/1973 | Krupp | 340/174 TF |
| 3,786,192 | 1/1974 | Chow | 340/174 TF |
| 3,786,428 | 1/1974 | Takahashi | 340/174 TF |
| 3,792,450 | 2/1974 | Bogar | 340/174 TF |
| 3,811,110 | 5/1974 | Inose | 340/174 TF |
| 3,820,091 | 6/1974 | Kohara | 340/174 TF |
| 3,916,396 | 10/1975 | Kohara | 340/174 TF |
| 3,936,883 | 2/1976 | Heckler | 340/174 TF |

*Primary Examiner*—Thomas B. Habecker
*Attorney, Agent, or Firm*—Frank R. Trifari; Daniel R. McGlynn

[57] ABSTRACT

The invention relates to a plate of magnetic material wherein magnetic domains can be formed and driven along guide structures consisting of discrete elements of magnetizable material, for example, vapor-deposited permalloy. The plate is used as a memory, a number of mainly parallel extending input structures forming paths for the domains between relevant outputs of the memory and relevant inputs of a decoding device. The decoding device comprises delay elements which can each be activated by a specific rotary field sequence. The output of the decoder device has connected thereto a detection element which can thus selectively detect a domain from a predetermined input structure, because exactly for the relevant domain a synchronization exists between a part of the rotary field sequence and the arrival of the relevant domain at a delay element. Therefore, neither further current wires are required for activating the decoding device, nor separate detection lines for detectors which are selective per input structure. A number of simple delay elements which have a compact construction and which can be readily activated are described.

8 Claims, 10 Drawing Figures

MEMORY DEVICE

The invention relates to a memory device, comprising a main magnetic field generator, a rotary magnetic field generator and at least one plate of magnetic material wherein magnetic domains can be sustained by a field of the main magnetic field generator which extends transverse to the plate, the said domains being drivable, under the control of a sequence of rotations in the positive and the negative sense of the field of the rotary magnetic field generator, along a domain guide structure which consists of discrete elements and which comprises a domain generating device, an input structure, a storage structure, a number of correspondingly arranged output structures, and a domain detection device which is connected parallel to the output structures. The magnetic "bubbles" are a known kind of domain. Such a memory device is known from the article by P. C. Michaelis and I. Danylchuk: "Magnetic bubble repertory dialer memory", Proceedings 1971 Intermag Conference, IEEE Transactions on magnetics, September 1971, pages 737 – 740. The said article describes a memory device comprising a storage structure consisting of one main loop and 38 storage loops wherein 48 words of 76 bits can be stored: each storage loop contains two bits of a word. Each storage loop is connected to the main loop via an intermediate structure comprising a diverging switch as an input switch and a converging switch as an output switch. Conversely, a second intermediate structure is provided for the transfer in the other direction. A diverging switch is to be understood to mean herein a domain guide structure comprising one input and two feasible outputs. A converging switch is to be understood to mean herein a domain guide structure comprising two feasible inputs and one output. A counter-clockwise rotation of the rotary magnetic field can be defined, for example, as "positive". For different rotary field sequences the same type of switch can act either as a diverging switch or as a converging switch. The above definition is applicable to the direction of transport of the domaines which is normally used in the memory device. A diverging switch is switched over by reversal of the direction of rotation of the rotary magnetic field, for example, for one period. Each of the storage loops comprises a converging switch along which domains can be input and a diverging switch along which domains can be output. When the rotary magnetic field rotates in the "normal" sense, the domains in the storage loops can continuously circulate, so they are stored. The capacity of the said memory is 3648 bits. In order to increase the capacity, the length or the number of the storage loops, or also the number of plates of material arranged in parallel inside the main magnetic field, can be increased. If only one domain detector is provided per plate, the time required for detecting a specific domain substantially increases as the capacity increases, because this domain must then be separately applied to the detector: the detector can be arranged, for example, in the main loop. Alternatively, using a complex control system it is possible to admit only a single domain to a detector: a complex device comprising, for example, many diverging switches could be used for this purpose. Furthermore, all storage loops can be separately connected to a separate detector element via an output structure. In that case there will be a very large number of detector elements. This is objectionable because, on the one hand, the required space is substantially increased, whilst on the other hand signal wires must be provided on the plate of magnetic material for given kinds of detector elements.

The invention provides a memory involving a short access time for reading. The invention provides a memory device wherein a single detector device can be connected to a plurality of storage loops. The invention provides a memory device wherein the driving of the magnetic domains is effected only by specific sequences of the rotary magnetic field. The invention provides loops structures whereby a difference in synchronization can be imparted to the magnetic domains with respect to each other in a simple manner. The invention provides a decoding device for the digital information embodied in the magnetic domains which occupies only little space. The invention provides a decoding device which can be selectively controlled by a rotary field sequence of limited length. This is achieved according to the invention in that the said output structures are provided with loop structures which have been displaced over discrete elements of the said output structures with respect to each other and which each time cover sub-trajects of the said outout structures, the said loop structures comprising each time an input position and an output position for a magnetic domain, each time a magnetic domain being drivable from the input position to the output position under the control of at least two rotary field sub-sequences of different net length, for forming a specific read code to distinguish each of the output structures in that, under the control of a rotary field sub-sequence which is synchronozed with the presence of a first magnetic domain for a first loop structure on a first output structure, the first magnetic domain is subjected to a relative shift with respect to further magnetic domains simultaneously present on second output structures the said sub-trajects.

The output structures can all be present on the same plate of magnetic material or not. Net length is to be understood to mean the algebraic sum of the various rotations of the rotary magnetic field. The instant of arrival of a domain at the detector device can be selectively controlled by the relative shift thus created between the domains, with the result that the relevant domain can be separately detected among a number of further magnetic domains, The relevant output structures preferably comprise each time $n$ of the said loop structures at $m$ different positions, so that an $n$-out-of-$m$ code can be formed. This results in a compact construction, enabling many different specific read codes to be formed, using only a small number of loop structures, This offers a saving as regards the space required per storage structure as well as regards the time required for reading a given information bit. It was found that the length of the rotary field sequence required for the specific control is limited and also that the structure thereof is simple.

Additional output structures which comprises a number of loop structures which differs from $n$ are preferably provided. As a result of these extra codes, the number of different specific codes is further increased, without additional space or time being required.

The loop structure preferably comprises an asymmetrical, mainly parallelogram-shaped discrete element, the ends of the long diagonal thereof connecting with input elements and output elements of the loop structure, the said ends furthermore forming the said input position and output position, respectively. This results in a loop structure of particularly simple construction: it comprises only a single discrete element of the domain guide structure. moreover, the various rotary field subsequences are simple, so that the relative shifts can be simply realized. The relative shift can amount to one as well as more than one full period of the domain guide structure.

The loop structure alternatively comprises two Y-shaped discrete elements in an anti-symmetrical and diametrically opposite position, separated by further discrete elements. This results in a further simple loop structure which has many feasible alternatives and which can simply be used for producing a synchronization difference amounting to one period of the rotary magnetic field.

The said further discrete elements are preferably T-shaped, the four discrete elements of the loop structure preferably having a base projecting outwards, or the said further discrete elements preferably including a T-shaped or Y-shaped discrete element, resipectively, which contray to he former Y-shaped elements, have an outwards projecting base. These are attractive alternatives for the described loop structure.

The invention also relates to a memory device, comprising a main magnetic field generator, a rotary magnetic field generator and at least one plate of magnetic material wherein magnetic domains can be sustained by a field of the main magnetic field generator which extends transverse to the plate, the said domains being drivable, under the control of a sequence of rotations in the positive and the negative sense of the field of the rotary magnetic field generator, along a domain guide structure which consists of discrete elements and which comprises a domain generating device, an input structure, a storage structure, an output structure, and a domain detection device, a loop structure being provided which consists of a single, mainly parallelogram-shaped discrete element, the ends of the long diagonal of the said element connecting with input elements and output elements which also form part of the domain guide structure, the said ends forming an input position and an output position, respectively, of the said loop structure as preferred positions for a magnetic domain, a magnetic domain being drivable from the said input position to the said output position by one half period of the rotary magnetic field in each of the two directions of rotation. Using wuch a loop structure, a variety of attractive functions can be realized in a memory device, such as decoding, re-allocation of information, driving a domain in a plate of magnetic material in a specific manner whilst domains in further plates of magnetic material are driven in an other manner, etc.

The storage structures are preferably connected to the relevant output structures via domain splitters which are composed of successive chevron lines which form part of a sequence of discrete elements of the domain guide structure, the sides of the chevron rows being mainly straight and extending in parallel, but a previous chevron row which is common to both outputs of a domain splitter partly projecting between subsequent chevron rows which are separate for the two outputs of the domain splitter, with the result that in the case of a rotary field direction which opposes the said projection, an intensified reluctance position for a domain is formed at this area, so that a domain then present at this area will be split. A domain splitter of this kind has a substantial operating margin and can be simply operated. Moreover, the space required on the plate of magnetic material is comparatively small. When domain splitters of this kind are used in conjunction with the described decoder, the same information can simultaneously be decoded, whilst elsewhere it remains stored for the time being in non-mutilated form. Therefore, the information read need not be written again by means of a complex control system. A reluctance position is to be understood to mean herein the opposite of a preferred position of a domain, i.e. a position in which the potential energy of a magnetic domain would be higher than in the surrounding area: a domain present therein would occupy an unstable position.

The invention will be described in detail hereinafter with reference to some figures.

FIG. 1 diagrammatically shows a device according to the invention.

Figure 1:
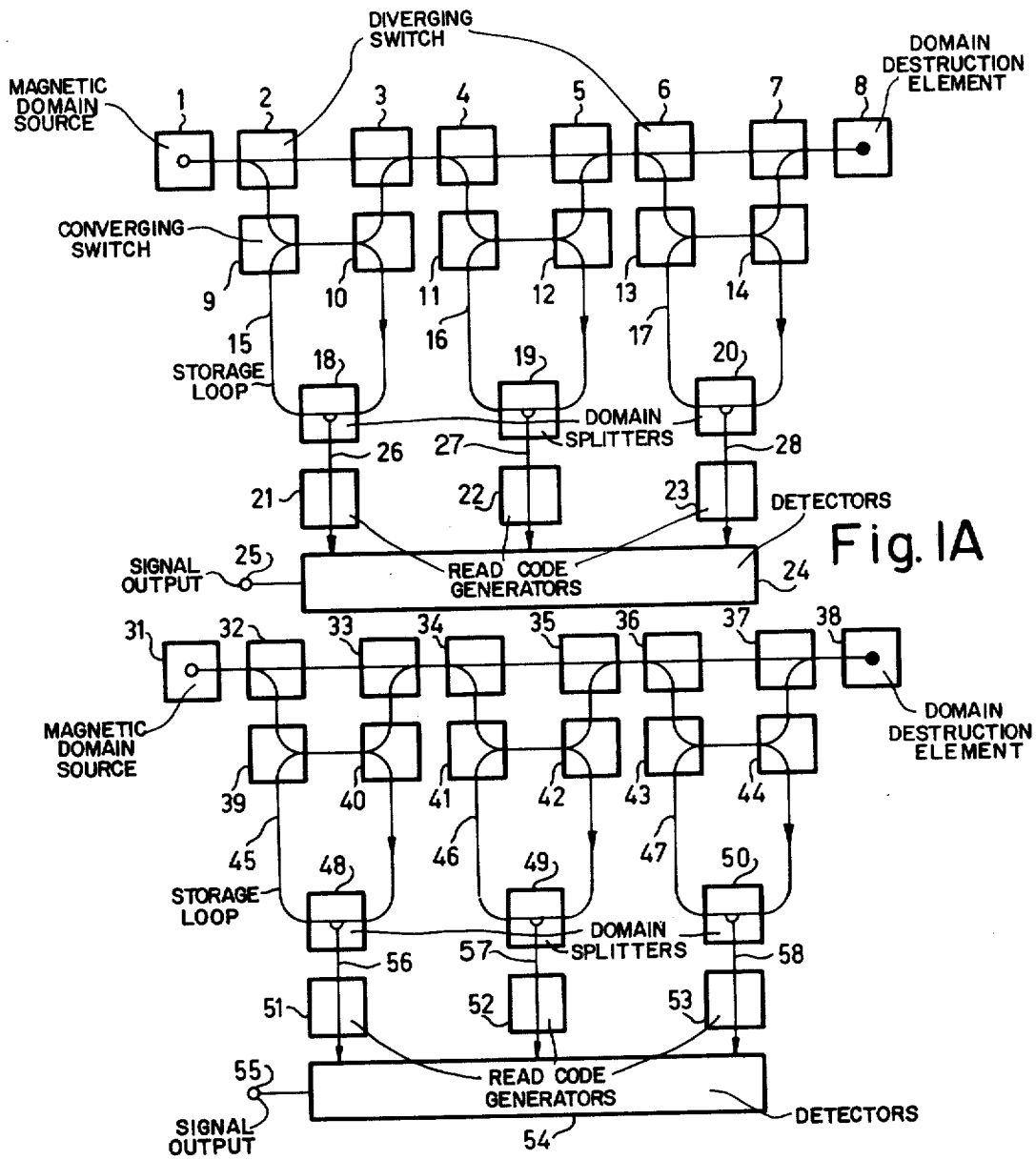

FIG. 1, comprising FIG. 1A of elements 1 to 24, and FIG. 1B of elements 31 to 54, diagrammatically shows a memory device according to the invention, comprising two source devices for magnetic domains 1, 31, twelve diverging switches 2, 4, 6, 10, 12, 14, 32, 34, 36, 40, 42, 44, twelve converging switches 3, 5, 7, 9, 11, 13, 33, 35, 37, 39, 41, 43, six domain splitters 18, 19, 20, 48, 49, 50, six storage loops 15, 16, 17, 45, 46, 47, six output structures 26, 27, 28, 56, 57, 58, with six read code generators 21, 22, 23, 51, 52, 53 which together constitute a decoding device, two detectors 24, 54, two signal outputs 25, 55, and two domain destruction elements 8, 38. The elements are only diagrammatically shown and comprise, for example, discrete elements of permalloy arranged on the plate of magnetic material. The plate of magnetic material can be arranged in a main magnetic field which extends, substantially transverse to the plate, and which may be generated by a permanent magnet. There is also present a rotary magnetic field which extends transverse to the main magnetic field, i.e. in the plane of the plate; this field is generated, for example, by two mutually transverse coils. There is also provided (not shown) a control device which can receive control information and data and which controls the actuation of the said rotary field coils. FIG. 1 comprises two halves; these two halves can either be accommodated on a single plate of magnetic material or on two parallel plates arranged within the main rotary magnetic field. The storage device can alternatively be constructed as a single coherent system, in that the second half of FIG. 1 is absent. A division into a plurality of sub-systems may also be advantageous.

If the rotary magnetic field is absent or stationary, all domains remain in place and nothing happens. When the rotary magnetic field rotates in the normal sense, for example, the positive sense (counter-clockwise), the source devices 1, 31 produce a domain, for example, in each period. The source devices 1, 31 can also be selectively actuatable, so that, for example, only one thereof (or in the case of a plurality of sources, only part thereof) generates a domain. The source devices can also comprise an encoder whereby a specific binary information pattern is produced which is embodied in the presence or absence of a domain in a given position, for example, within an information word. The domains are subsequently transported, driven by the rotary magnetic field, to the sequence of switches 2 . . . 7, 32 . . . 37, and if nothing happens on their way they are destroyed in the domain destruction elements 8, 38. Similarly, any domains present in the loops 15, 16, 17, 45, 46, 47 are continuously circulated in the direction of the arrow. The diverging switches 2, 4 . . . 44 can be switched over under the control of a specific rotary field sequence, for example, 7/4 periods of the rotary field in the negative sense, followed by further rotation in the positive sense. The domains are then applied to the relevant converging switches 9, 11, 13, 3, 5, 7 . . . 37, with the result that a domain moves from the input structure (between elements 1/8 and 31/38) to the relevant storage structure (15, 17 . . . 47) or vice versa. The input structure can have its output connected to its input, and in that case the known organization comprising major and minor loops is obtained. When a domain leaves a storage loop, it can be applied to the next storage loop or it can be destroyed. When the distance between successive diverging switches 2, 4, 6 is made equal to the intervals between successive domains generated by the source device 1, they can be applied together in parallel, for example, as a word, to the storage loops 15, 16, 17. Under the control of given rotary field sequences, the domain splitters 18, 19, 20, 48, 49, 50 can be activated (these splitters will be described in detail hereinafter).

If a domain arrives at exactly that instant, this domain is split into two portions; one portion remains present in the storage loop along which it was previously driven, the other portion being driven as an independent domain along the relevant output structure. If a plurality of domains are simultaneously split, and if the rotary magnetic field subsequently continues to rotate in the positive sense, these domains will also arrive together at the domain detectors 24, 54, which detect these domains together according to a logic OR-function and which supply a corresponding output signal on the outputs 25 and 55, respectively. It is often desirable to detect a specific domain for presence. To this end, the output structures include specific read code generators which can be activated by a specific rotary field sequence so as to disturb the synchronization between simultaneously split domains, so that they arrive at the detectors 24 and 54 at different instants, with the result that they can be separately detected, without it being necessary for each of the detectors to comprise different sub-detectors and associated signal outputs. The split domains can be applied to a series parallel convertor, as effected by the converging switches 3, 5, 7 etc., but a substantially longer read time would then be required.

Figure 2:
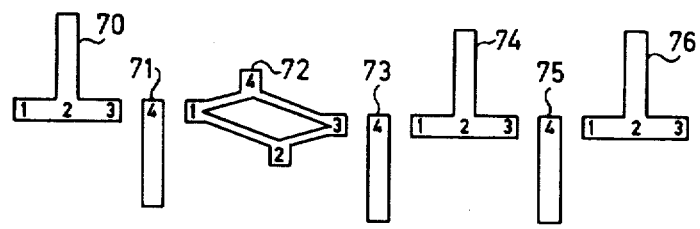
FIG. 2 shows a first loop structure according to the invention.

FIG. 2 shows a first loop structure according to the invention. The Figure shows discrete elements of the domain guide structure provided on the plate of magnetic material. These elements may consist, for example, of vapour-deposited permalloy, the various elements being simultaneously deposited in accordance with a pattern present in one mask. The use of a single mask not only offers a simple manufacturing process, but it is not necessary either to adjust various masks very accurately with respect to each other. Moreover, there are no separate electrical conductors which must be especially excited. As a result, there are no synchronization problems. The Figure shows three T-elements 70, 74, 76, three I-elements 71, 73, 75 and one element 72 which is parallelogramshaped in a first approximation (the "sides" of the parallelogram are of different length). Under the influence of a magnetic field in the plane of the drawing, domains tend, for example, to move on the permalloy in the direction of the said magnetic field. If the rotary magnetic field is directed to the left in the plane of the drawing, a domain will be present, for example, in position 1 of T-element 70: notation 701. If the field rotates downwards in the plane of the drawing, the next position will be 2 on T element 70: notation 702. If the field rotates to the right and if the field rotates upwards in the plane of the drawing, the domain will jump to position 714 on I-element 71. If the field rotates further clockwise, the next preferred positions will be 721, 722, 723. If the rotary field subsequently rotates upwards in the plane of the drawing, the next preferred position will be 734 rather than 724, because the former is "nearer". This "being nearer" is not only determined by the geometry, but also by the magnetic properties and the shape of the permalloy elements. If the rotary magnetic field rotates further counterclockwise, the next preferred positions will be 741, 742, 743 . . . 763. If the domain starts in position 763 and the magnetic field rotates clockwise, the following preferred positions will be successively realized: 762, 761, 754 . . . 723, 722, 721, the rotary magnetic field being directed to the left in the latter position. If the field in the plane of the drawing then then rotates upwards, the next position will be 724 rather than 714, because the former is "nearer." This is due to the fact that the basic shape of the element 72 is a scalene parallelogram. During further clockwise rotation, the next preferred positions will be 723 and 722, so that the magnetic domain thus remains continuously bound to the discrete element 72 and reaches the same preferred position during each period of the rotary field. If in any of the preferred positions 721 . . . 723 the direction of rotation of the rotary magnetic field becomes counter-clockwise again, the domain will leave the element via the positions 723, 734, 741. If the clockwise direction of rotation is deemed to be negative, position 722 will be reached from position 721 after the following rotary field sequences: (a) + 2/4, (b) −2/4, (c) −6/4, (d) 31 10/4, so that from the input position 721 (to be defined as such) a domain can be driven to the output position 723 of the loop structure in two different rotary field subsequences which each have a length of only one half period. Other positions on the discrete element 72 could also be defined as input and output positions. A domain can be driven from position 723 to position 721 by the rotary field sequences: (a) −2/4, (b) −6/4, (c) −10/4. These sequences can be combined. The net length of the rotary field sequence between two other preferred positions, provided that no intermediate preferred position is situated on the element 72, however, is always the same, so from 723 to 763 it always amounts to exactly two net periods positive. If a counter-clockwise rotation is followed by a period of clockwise rotation, the domains in the positions 721, 722, 723 will return to the output position, whilst all other domains will be set back over one period of the domain guide structure, and are thus subjected to a relative delay. The fact that the reversal may occur between the positions 721 and 723 offers an ample tolerance.

Figure 3:
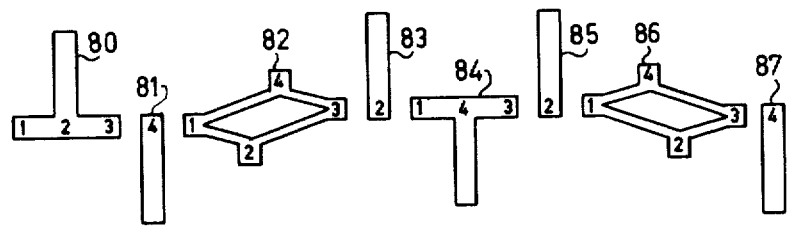
FIG. 3 shows a second loop structure according to the invention.

FIG. 3 shows a second loop structure according to the invention as an elaboration of the structure shown in FIG. 2. The device comprises the I-elements 81, 83, 85, 87, the T-elements 80 and 84, and the parallelogram-shaped elements 82, 86. The first portion of the FIG. is analogous to FIG. 2. However, if the rotary field rotates counter-clockwise, a domain will always remain bound to the element 82. If the direction of rotation is subsequently reversed, the domain will move, via the positions 823, 832, 841, 844 . . . 861, to the element 86 whereto it will remain bound again until the direction of rotation of the rotary magnetic field is reversed again. If the direction of rotation is reversed too soon, the element 86 will not yet have been reached, and the domain will return to element 82. The following are some rotary field sequences for moving from position 821 to position 874:

a. +2/4(823); −8/4(863); +¼(874); net −5/4,
b. +6/4(823); −8/4(863); +¼(874); net −1/4,
c. +14/4(823); −8/4(863); +¼(874); net +7/4,
d. +2/4(823); −16/4(863); +1/4(874); net −13/4.

The total rotary field sequence can thus have a positive as well as a negative sign. It will be obvious that such a relative shift between domains with respect to each other can be utilized in various manners. If the main path is constructed as a loop in FIG. 1, having a loop structure according to the invention, given information bits or words can be shifted. This results in re-allocation. It is known per se to arrange the information in a memory device dynamically by reallocation such that the most recently used information is more quickly accessible. It is alternatively possible to generate a specific input code by means of a number of loop structures in an input structure. The use of loop structures in a decoder will be described hereinafter. The construction shown in FIGS. 2, 3 requires only little space; the dimension of the loop structures (elements 72, 82, 86) in the direction of the path only slightly exceeds that of a T-element; transverse to the path, this dimension is even smaller.

The parallelogram-shaped elements can be proportioned in different manners. It was found to be advantageous to make the "sides" of the parallelogram approximately half as thick (i.e. in the transverse direction in the plane of the drawing) as the other elements. The other ratios are shown in the FIG. It will be obvious that the idea of the invention is not restricted to the embodiment shown. In the foregoing parallelogram-shaped elements were combined with a domain guide structure composed of T-elements and I-elements. Loop structures of this kind can similarly be combined, following the idea of the invention, with domain guide structures comprising chevron-shaped or Y-shaped elements. Furthermore, in the foregoing the parallelogram-shaped elements were used at locations wherefor the remaining T-shaped elements were used. It will be obvious that they can be included also at the location of I-shaped elements. Input and output can then be situated at the same end as well as on different ends of the long "diagonal" of the parallelogram-shaped element.

Figure 4:
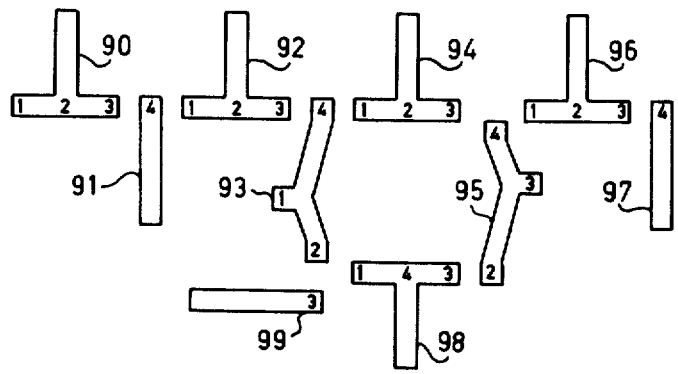
FIG. 4 shows a third loop structure according to the invention.

FIG. 4 shows a third loop structure according to the invention. The device comprises the T-elements 90, 92, 94, 96, 98, the I-elements 91, 97, 99 and the Y-elements 93, 95. If the direction of rotation is continuously counter-clockwise, the domains will follow the main path, i.e. from position 901, 902 via the positions 923, 934, 941, 942, 943, 954, 961 . . . 974. The position 934 can act, for example, as the input position and the position 954 can act as the output position. The intermediate traject can then be completed under the control of a rotary field sub-sequence of +1 period. If a domain arrives at the position 954 and the direction of rotation of the rotary magnetic field is reversed for one half period, first the position 953 will be reached ("nearer" than position 943) and subsequently the position 952. If subsequently the direction of rotation becomes counter-clockwise for a full period, the position 932 will be reached via the position 983 ("nearer" than position 953) and the positions 984, 981. By a further rotary field rotation of +¼ period, the position 993 can possibly be reached, but this does not influence the net length of the rotary field sub-sequence. If the direction of rotation of the rotary field is reversed once more, the positions 931 and 934 will be reached (possibily 923). If the original direction of rotation is restored, the path will be: 941, 942, 943, 954, 961. The required rotary field sub-sequence is therefore: +4/4(954) −2/4(952) +4/4(932) −2/4(934) +¼(954), the net total being 8/4 periods. This sequence produces a relative delay of one period instead of the relative acceleration by the activation of the loop structure in FIG. 2.

The loop structure shown in FIG. 4 can also be passed through in the opposite direction, but the main path which is eaxh time to be completed is then situated along the elements 96, 95, 98, 93, 92. A domain can be driven between the input position 954 and the output position 934 by the following rotary field sub-sequence: −2/4(952) +4/4(932) −2/4(934), which equals zero periods net. The return from position 934 to position 954 requires +1 period. Therefore fore, the next rotary field sub-sequence between input position and output position required 0+1+0 is +1 period net. The object of the invention is also realized by the passage in this direction.

Figure 5:
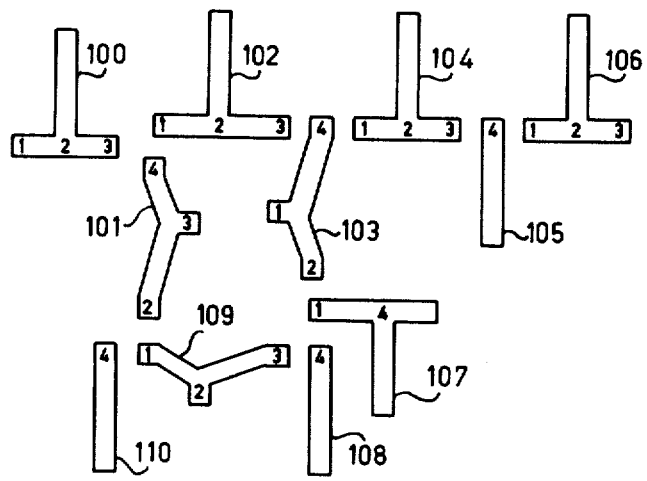
FIG. 5 shows a fourth loop structure according to the invention.

FIG. 5 shows a fourth loop structure according to the invention. The device comprises the T-elements 100, 102, 104, 106, 107, the I-elements 105, 108, 110 and the Y-elements 101, 103, 109. If the direction of rotation of the rotary magnetic field is continuously counter-clockwise, the domains will follow the main path along the positions 1001, 1002, 1003, 1014, 1021, 1022, 1023, 1034, 1041, 1042, 1043, 1054, 1061, 1062, 1063. When a domain has arrived at position 1014 and the direction of rotation of the rotary magnetic field becomes clockwise for 3/4 or 4/4 periods, the domain will move to position 1013 ("nearer" than position 1003), subsequently to the positions 1012, 1091 and possibly to position 1104. When one of the latter two positions has been reached and the direction of rotation of the rotary magnetic field becomes counter-clockwise again, the next positions will be 1092 ("nearer" than 1012), 1093, 1084, 1071, 1032. If the direction of rotation subsequently becomes clockwise again, the next positions will be 1031 ("nearer"), 1034, and possibly 1023. If the direction of rotation subsequently becomes counter-clockwise again, the main path will be followed. The driving along the main path between the positions 1014 and 1034 requires a rotary field sub-sequence of +4/4 periods. The circulation through the loop structure requires (starting from position 1014) a rotary field sub-sequence of −¼(1091) + 5/4(1032) −2/4(1034) periods, which equals zero periods net. The passage of the loop structure thus produces a relative acceleration of one period. Contrary to the structure shown in FIG. 4, this structure cannot be used in the other direction, because the change-over from position 1014 to position 1003 is not possible.

Figure 6:
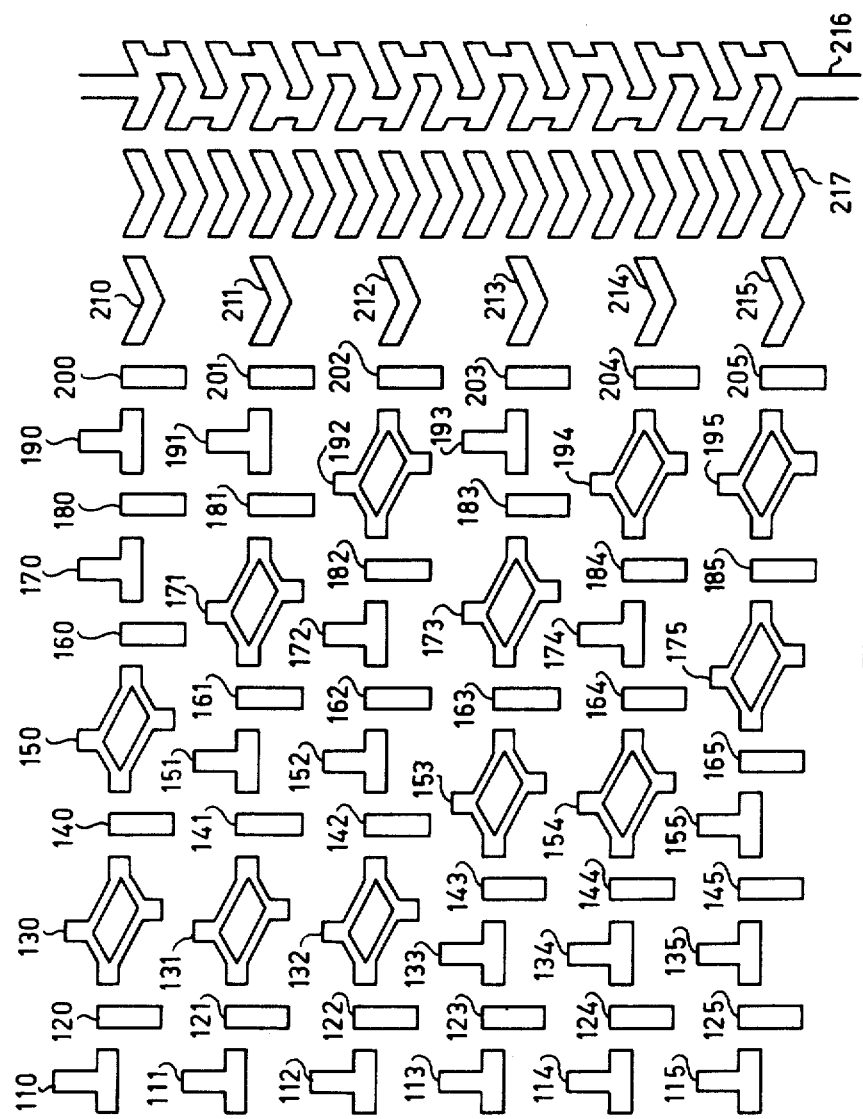
FIG. 6 shows a decoder according to the principles of the invention.

FIG. 6 is a somewhat stylized representation of a decoder which is capable of forming a specific read code. The device comprises T-elements 110A, 111, 112, 113, 114, 115, 133, 134, 135, 151, 152, 155, 170, 172, 174, 190, 191, 193, I-elements 120 . . . 125, 140 . . . 145, 160 . . . 165, 189 . . . 185, 200---205, the mainly parallelogram-shaped elements 130, 131, 132, 150, 153, 154, 171, 173, 175, 192, 194, 195, single chevrons 210 . . . 215, a chevron strip 217 and a chevron detector 216. The discrete elements from guide structures for magnetic domains on the same basis as the structure shown in FIG. 2. The T-elements 110 . . . 115 may adjoin outputs of the storage structures wherefrom domains can be supplied under the control of a counter-clockwise direction of rotation of the rotary magnetic field. The storage structures not shown may have a transverse dimension which is larger than that which corresponds to the distance between neighbouring domain guide structures which are shown to be near to each other for the sake of simplicity. If a domain reaches the chevron strip 217, it will fill the entire length of the said strip due to expansion. The same is applicable to the chevron detector 216 (the successive chevrons thereof are each time interconnected by an intermediate strip). The detection of a magnetic domain by means of such a detector is known per se and is based on a variation of the resistance of the detector which is included in an electrical circuit by means of the supply lines shown on the ends thereof.

If two domains arrive simultaneously at the detector 217, they will not be separately detected. If separate detection is required, each channel can be provided with its own detector. The large number of supply wires is objectionable, and moreover, the space occupied is such that per separate detector a substantial surface area of the plate of magnetic material is required. The device shown in FIG. 6 has for its object to realize separate detection of domains by a common decoder. To this end, FIG. 6 shows a number of loop structures of a construction as shown in FIG. 2. Assume that a number of domains are simultaneously present, for example, on the T-elements 110, 115, and that the rotary magnetic field is directed to the left. The following rotary field sequence will then be performed.

a. one period counter-clockwise (+1): the domains will then be at the input positions of the elements 130-135,
b. one period clockwise (−1): the domains will then be at the input positions of the elements 130, 131, 132, 113, 114, 115, so that those in the first three paths, have not been set back,
c. one period counter-clockwise (+1): the domains will then be at the input positions of the elements 150, 151, 152, 133, 134, 135,
d. one period clockwise (−1): the domain will then be at the input positions of the elements 150, 131, 132, 113, 114, 115, so that only the domain the first path has not been set back,
e. three periods counter-clockwise (+1+1+1): the first domain will then be at the input position of element 210; the other domains will lag by one or two periods. After one further period of the rotary magnetic field, the first domain will reach the chevron strip 217 and will expand. After a final period, the first domain can then be simply detected by a signal from the chevron detector 216 which appears only if a domain was present on the first path. The remaining domains will be detected during later periods, but not separately. Therefore, the above rotary field sequence was, starting from the input positions of the elements 130-135 as far as the input position of the chevron elements 210 . . . 215: −1+1−1+1+1+1. The combinations (−1+1) can be represented as a binary 0, and the single counterclockwise rotations as a binary 1, so that the notation is: 0 0 1 1. The second channel is decoded using the sequence: −1+1+1−1+1+1, which can be written as 0 1 0 1. The codes of the remaining channels are 0 1 1 0, 1 0 0 1, 1 0 1 0, 1 1 0 0, respectively. The decoder shown in FIG. 6 each time forms a 2-out-of-4 code. Six permutations are thus feasible.

According to the described decoding, the relevant domain was detected as a first domain. However, it can also occupy the last position. This is possible for the domain on the first path using the following sequence: starting from the input positions on the elements 130 − 135.

a. +1 period: positions on 150 − 155.
b. +1 period: positions on 170–175,
c. −1 period: positions on 150, 171, 152, 173, 154, 175,
d. +1 period; positions on 170, 191, 172, 193, 174, 195,
e. +1 period: positions on 190, 211, 192, 213, 194, 215,
f. −1 period: positions on 170, 191, 192, 193, 194, 195,
g. +1 period: positions on 190, 211, 212, 213, 214, 215,
h. +1 period: positions on 210, 217 . . . 217.

The rotary field sub-sequence −1+1+1 can then be noted as a binary 0 and the rotary field sub-sequence +1 as a binary 1. The specific read code will then be 1 1 1 0 0. Similarly, the specific read code for the other paths will be 1 0 1 0, 1 0 0 1, 0 1 1 0, 0 1 0 1, 0 0 1 1, respectively. The said separate detection of the domain arriving first offers the advantage that less time is required. The first method requires six periods of the rotary field, whilst the second requires eight. The time was measured between the input positions of the elements 130-135 and 210-215. The difference is accordingly large for other reference points.

Figure 7:
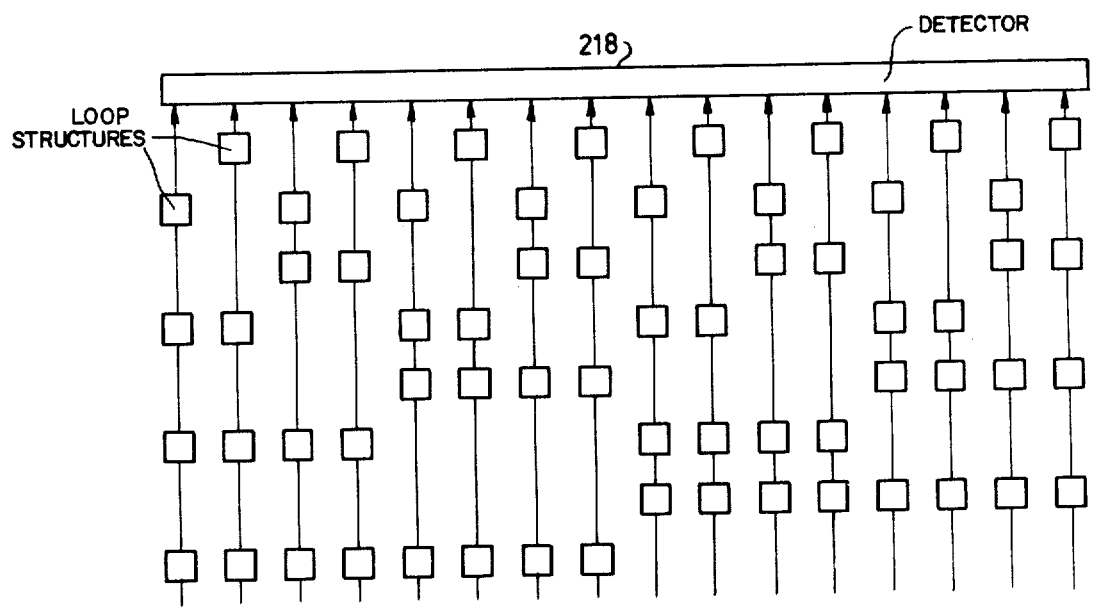
FIG. 7 shows a further decoding diagram according to the invention.

FIG. 7 shows a coding organization according to a binary system: a square denotes a loop structure, for example, according to element 270 of FIG. 2. All sixteen paths lead to the detector 218 which is only diagrammatically shown. In the cases of first-domain detection, the first path from the left is decoded by the rotary field sequence (−1+1)+1(−1+1)+1(−1+1)+1)−1+1)+1, which can be written as 01010101 analogous to the foregoing. Analogously, the code for the sixth path from the left is: 0 1 1 0 0 1 1 0. Successive binary code elements are each time either 0 1 or 1 0. FIG. 7 shows sixteen possible combinations, involving 64 loop structures in total and a depth of eight periods per path.

Figure 8:
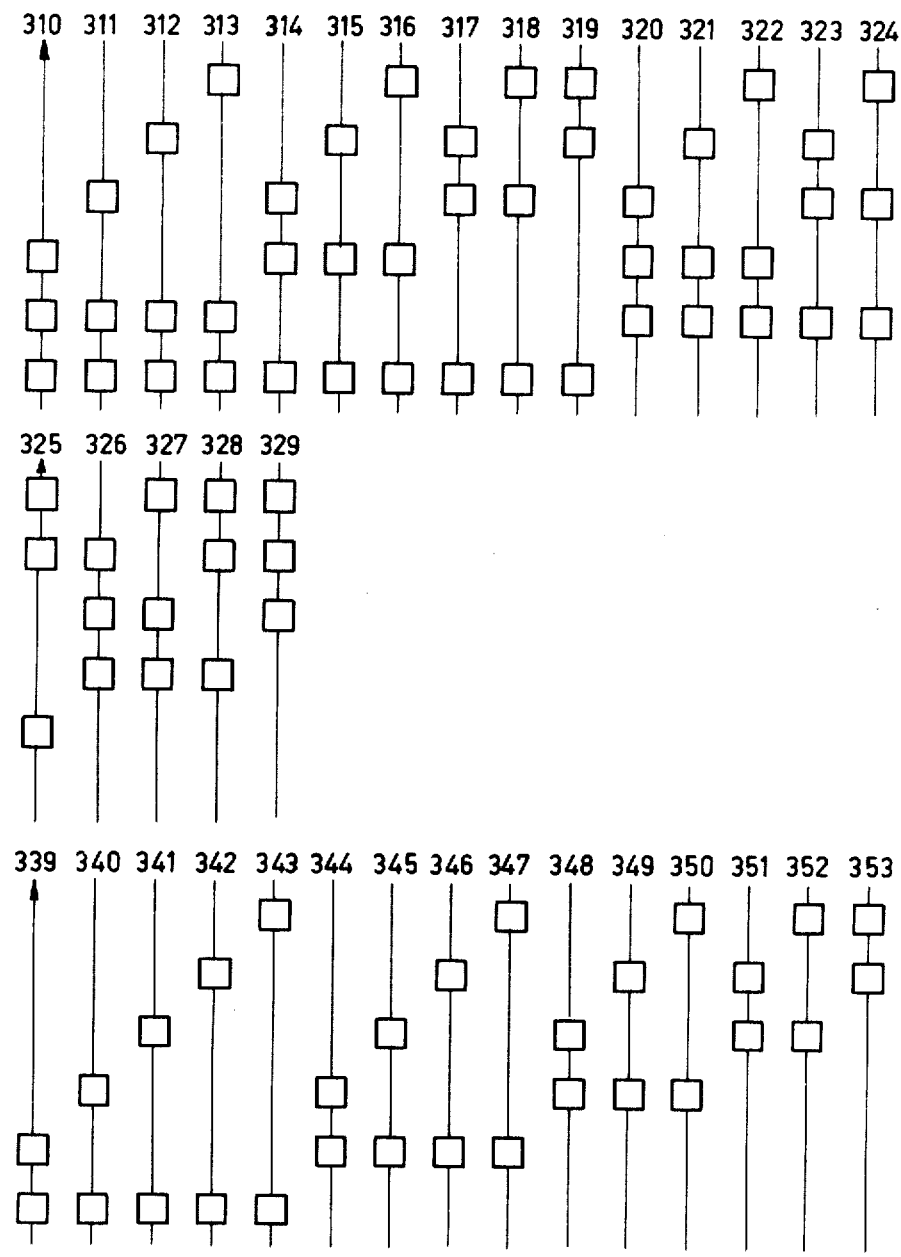
FIG. 8 shows a further decoding diagram yet according to the invention.

FIG. 8 shows a further decoding diagram according to the invention, showing only the channels 310–329 and 339–353 and the loop structures which are shown as blocks therein. The detector is connected in parallel to the channels at the top and is not shown for the sake of simplicity. It will be possible for all channels to be situated in a single line in a device. The channels 310–329 are decoded according to a 3-out-of-6 code; this results in twenty possibilities, at a depth of six periods per path and three loop structures per path. First-domain detection then requires 6 + 3 = 9 periods of the rotary field sequence, increased by the time required for transport to the decoding structure and from there to the detector structure. The organization shown in FIG. 7 offers only sixteen possibilities at a depth of eight periods per path with four loop structures each, and a required rotary field sequence of twelve periods. According to the already described principles, in the case of firstdomain detection the specific code of the path 310 is. for example, 0 0 0 1 1 1, that of the path 313 being 1 1 0 0 0 1. At a depth of eight periods per path and each time four loop structures per path. Their would be (8/4) =8!/4!4! = 70 possibilities, a rotary field sequence having a length of twelve periods being required for first- domain detection.

The number of possibilities is sometimes too small for a given path length. In the same configuration of the paths 310–329, for example, the paths 339–353 can be included, while using at the same time the principle of "last-domain detection" which has already been described. These paths are coded according to a 2-out-of-6 diagram, which offers 6!/.2!4! = 15 possibilities. Path 339, for example, is selected by the rotary field sequence: $+1+1-1+1+1-1+1+1-1$ $+1+1-1+1+1$, specific code: 1 1 0 0 0 0. After the third period (−1), the paths 311, 312, 313, 317, 318, 319, 323, 324, 325, 329, 339, 341, 342, 343, 345, 346, 347, 351, 352, 353 will still be in phase. All other paths will lead by one period. After the sixth period, the paths 312, 313, 319, 325, 339, 342, 343, 346, 347 and 353 will still be in phase. After the ninth period, the paths 313, 339, 343 and 347 will still be in phase. After the twelveth period, the path 339 will have been selected. The required rotary field sequence has a length of 6+4+4 is 14 periods. Similarly the other paths of the paths 339–350 can be separately detected. In this manner there are 35 possibilities at a path length of six periods. Similarly, the combination can be formed from a number of paths according to a 4-out-of-6 code with first-domain detection, and according to a 3-out-of-6 code with last-domain detection. Sub-trajects with and without loop structures must then be interchanged in the paths 339–353. The path 310 is then selected by means of the rotary field sequence $+1430$ $1+1-1+1+1-1_a+1-1+1+1$. After the fourth period (−1), the paths 310, 312, 313, 315, 316, 319, 321, 322, 325, 328, 341, 345, 348, 351, 352 will still be in phase. The paths 310, 313, 316, 322, 351 will still be in phase after the seventh period. The path 310 will have been selected after the tenth period. The required rotary field sequences in this case have a length of 6+4 = 10 periods and 6+3+3 = 12 periods for first-domain detection and last-domain detection, respectively. The differences have thus been reduced. The length of all rotary field sequences can be equalized for given combinations, for example, by combination of a 3-out-of-8 code and a 6-out-of-8 code.

In FIG. 8 other codes can be selected for first-domain detection. For example, the code 0 0 1 1 1 1 (−1+1−1+1+1+1+1+1) forms a logic OR-combination of domains on the paths 310, 311, 312, 313, 339. This can sometimes be advantageous.

Figure 9:
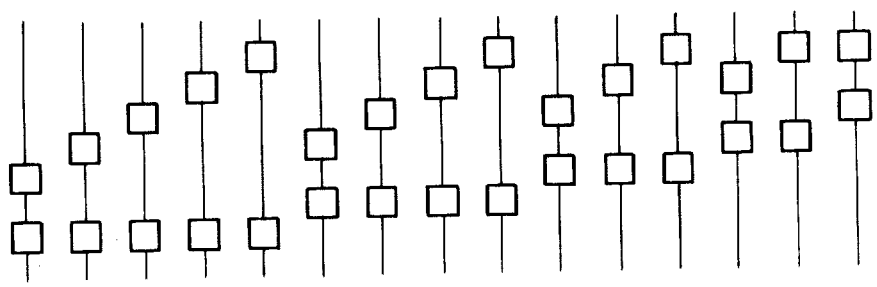
FIG. 9 shows a still further decoding diagram according to the invention.

FIG. 9 shows a futther decoding diagram according to the invention. In the configurations shown in the FIGS. 3 and 6, the difference in location between successive loop structures is to be chosen between 1, 2, .. . full periods of the domain guide structure. FIG. 9 shows that it may be advantageous to choose other values, for example. 1, 1½, 2, 2½. . . . periods of the domain guide structure. In given cases the path length of the output structures can then be further reduced, or for the same path length the number of possibilities can be increased.

Figure 10:
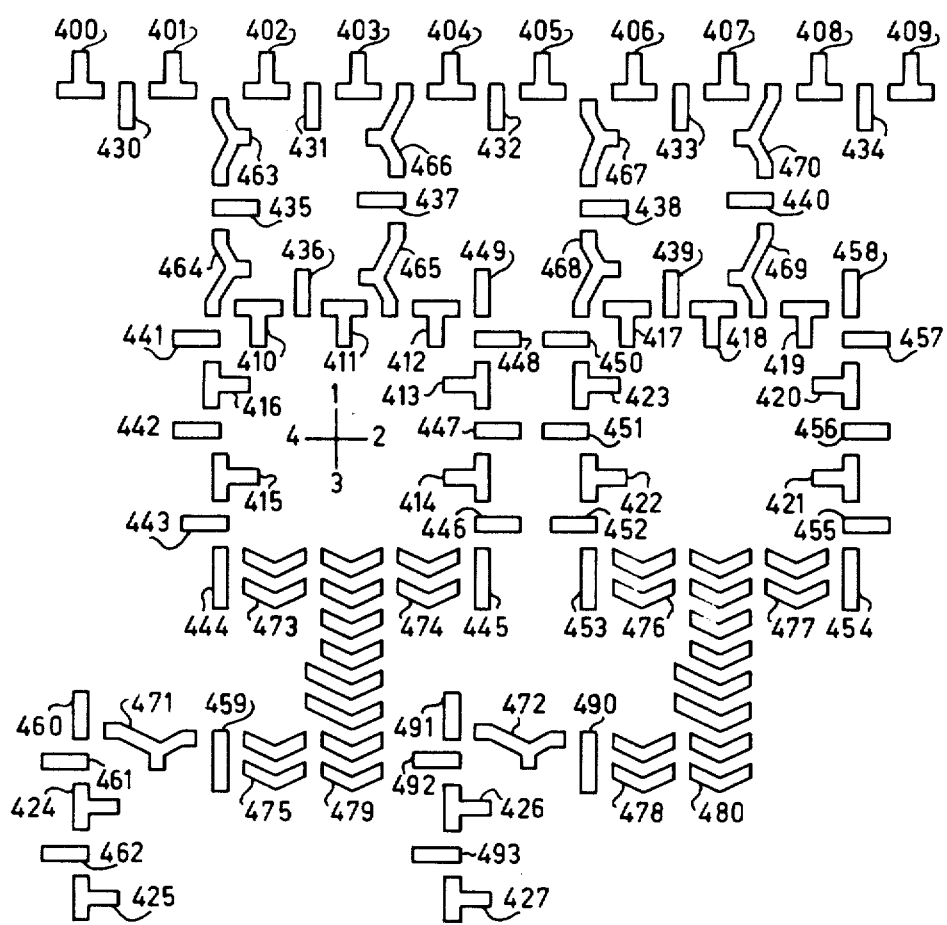
FIG. 10 shows a storage structure comprising domain splitters and switches.

FIG. 10 shows storage structures comprising domain splitters and switches (diverging switches and converging switches). The Figure shows T-elements 400, 427, I-elements 430–462, 490–493, Y-elements 463–472, double chevron elements 473, 478 and chevron paths 479–480. The positions on the discrete elements are indicated according to the system of co-ordinates shown. The position at the top of the element 464 is thus noted as 4641, analogous to the description given with reference to the FIGS. 2-5. Like in FIG. 1, the storage structure can be composed in accordance with the major loop and auxiliary loop principle. The elements 400–409, 430–434 form part of a major loop along which a domain can be driven from the left to the right under the control of a counter-clockwise direction of rotation of the rotary magnetic field. The device is further controlled as follows. When a domain is present at position 4631 and the direction of rotation of the rotary magnetic field becomes clockwise (negative) for 6/4 periods and subsequently becomes positive again, the domain will move to position 4643, subsequently to position 4412, and will then successively pass through the left auxiliary loop (elements 410–416, 436, 441–449, 464, 465, 473, 474, 479) in the counter-clockwise direction. When a domain is present at position 4653 and the direction of rotation of the rotary magnetic field becomes clockwise (negative) for 6/4 periods and subsequently becomes positive again, the domain will move to position 4661, subsequently to position 4044, and will subsequently pass through the major loop in the direction of the element 409. When a domain arrives at the element 473 and the rotary magnetic field rotates upwards (direction 1), a preferred position will be present on the facing sides of the elements 473 and 479; notation 4731/4791. The domain can then expand over the entire length of the chevron path 479. This expansion is certainly effected if the rotary magnetic field rotates through a further +¼ period. The domain remains in the expanded condition if the magnetic field is further rotated through +¾ period until position 4791/4741 is reached. If the domain reaches the position 4744 after a further quarter period of the rotary magnetic field, it will be compressed again. If an (expanded) domain is present at position 4794, the domain splitter can be activated by a rotary field sub-sequence of 8/4 periods of clockwise rotation, followed by counter-clockwise rotation. Starting from the position 4794, after −¼ period the ends of the double chevron elements projecting to the right will form preferred positions. This is not at all the case for the chevrons of the chevron path 479 which project to the left, more or less between the elements 473 and 475; if a domain were present at this area, it would be immediately removed therefrom. These projecting parts thus constitute a so-termed reluctance position. Therefore, if a domain were originally present, it would be readily split into two portions, i.e. on the elements 473 and 475, also under the influence of this reluctance position. The addition of the said projecting parts to the chevron path 479 so that these parts project more or less between the double chevron elements 473, 475, was found to stimulate the splitting of the domains locally present, with the result that the domain splitter operates reliably and that its operating margin is improved. If the direction of rotation of the rotary magnetic field remains negative after the splitting of the domain, the position 4714 will be reached after two periods (calculated from the position 4794). If the direction of rotation of the rotary magnetic field then becomes positive again, the next preferred positions will be: 4603, 4612, 4241 . . . 4253. A decoding path as described can be connected to this output structure. The Figure shows, by way of example, two corresponding auxiliary loops annex domain splitters. The chevrons can be differently proportioned, the chevrons may notably be thinner and their spacing may be smaller. Further elements of the domain guide structure, such as domain generators and domain destruction elements, are not shown. The invention does not specifically relate to these elements.

The displacement of a domain from the major loop (path 400 . . . 409) to a storage loop and vice versa is controlled by a rotary field sub-sequence of −6/4 periods. This is shorter than the rotary field subsequence required for splitting, i.e. −8/4 periods. When a domain is supplied, starting from position 4631, a domain can be split (starting from position 4731/4791), but it will not move beyond position 4713, and if the direction of rotation of the rotary magnetic field then becomes positive again, the split-off domains will return to the chevron path 479 where they will be combined and subsequently compressed again. When a domain is discharged, starting from the position 4653, a domain can at the most have reached the position 4591 after −6/4 periods, after which the splitting will be cancelled as described above.

If a domain is split, starting from the position 4794, a further domain can be present at position 4114. After 31 ⅓ periods, this domain will reach the position 4653; after −8/4 periods it will reach the position 4664. If the direction of the rotary magnetic field then becomes positive again, the relevant domain will go back and reach the position 4114 again after +8/4 periods. Other domains cannot leave the auxiliary loop either. On the other hand, it would be possible for a domain to start at position 4024 and reach the position 4104 after −8/4 periods. if the splitting and the supply of domains may not take place simultaneously, therefore, no domains may be present in the relevant part of the major loop during splitting. The requirement can be readily satisfied.

Instead of the loop structure shown in FIG. 2, notably the loop structures shown in the FIGS. 4, 5 can be used in devices shown in the FIGS. 7 – 10, all above considerations remaining valid, be it that adaptations will be required such as appropriate rotary field sub-sequences for the control.

What is claimed is:

1. A memory device comprising
a plate of magnetic material capable of maintaining magnetic domains therein;
a domain guide structure in said plate for guiding the transport of said magnetic domains therein, comprising a plurality of discrete elements including a domain generating device, an input structure connected to said generating device, a storage structure connected to said input structure, and an output structure connected to said storage structure, and including loop structures displaced over discrete portions of said output structure for selectively controlling the transport of a magnetic domain from a first position to a second position on a predetermined one of said loop structures under control of at least two external rotary magnetic field sequences of different duration which distinguish each of said output structures by synchronization with the presence of magnetic domains on said loop structures.

2. A memory device as claimed in claim 1, wherein said output structures each time comprise n of said loop structures at m different positions, so that an n-out-of-m code is formed.

3. A memory device as claimed in claim 2, further comprising additional output structures are provided which comprise a predetermined number of loop structures which differs from the number n.

4. A memory device as claimed in claim in claim 1, wherein each of said loop structures comprise an asymmetrical, mainly parallelogram-shaped discrete element, the ends of the long diagonal thereof connecting with input elements and output elements of each of said loop structures, said ends furthermore forming said first position and said second position, respectively.

5. A memory device as claimed in claim 1, wherein each of said loop structures comprise two Y-shaped discrete elements disposed in an anti-symmetrical and diammetrically opposite, separated by discrete elements.

6. A memory device as claimed in claim 5, wherein said discrete elements comprise four T-shaped elements of said loop structure having outwards projecting base legs.

7. A memory device as claimed in claim 5, wherein said discrete elements include a T-shaped or Y-shaped discrete element, respectively, which, contrary to the former Y-shaped elements, have an outwards projecting base leg.

8. A memory device as claimed in claimed in claim 1, wherein said storage structures are connected to corresponding ones of said output structures by means of domain splitters, including a sequence of chevron lines forming part of a sequence of discrete elements of said domain guide structure, the sides of said chevron lines being substantially straight and parallelly extending with one of said chevron lines common to both outputs of a domain splitter and partly projecting between subsequent ones of said chevron lines separating the two outputs of the domain splitter, so that a rotary field direction opposing said projection produces an intensified reluctance position for a domain formed, thereby splitting a domain present.

* * * * *